United States Patent [19]
Cummings et al.

[11] Patent Number: 5,663,018
[45] Date of Patent: Sep. 2, 1997

[54] PATTERN WRITING METHOD DURING X-RAY MASK FABRICATION

[75] Inventors: Kevin D. Cummings, Phoenix; William A. Johnson, Paradise Valley, both of Ariz.; Daniel L. Laird, Madison, Wis.

[73] Assignee: Motorola, Schaumburg, Ill.

[21] Appl. No.: 654,457

[22] Filed: May 28, 1996

[51] Int. Cl.⁶ ............................................... G03F 9/00
[52] U.S. Cl. ........................ 430/5; 430/322; 378/34; 378/35
[58] Field of Search ................ 430/5, 322; 378/34, 378/35

[56] References Cited

U.S. PATENT DOCUMENTS

| | | | |
|---|---|---|---|
| 5,318,687 | 6/1994 | Estes et al. | 430/5 |
| 5,500,312 | 3/1996 | Harriott et al. | 378/34 |
| 5,529,862 | 6/1996 | Randall | 430/5 |

*Primary Examiner*—S. Rosasco
*Attorney, Agent, or Firm*—Eugene A. Parsons

[57] ABSTRACT

A pattern writing method for X-ray mask fabrication including forming a uniform membrane layer on an X-ray absorbing layer and forming an etch mask on the layer of X-ray absorbing material including the steps of providing a layer of material sensitive to radiation. The layer of material has internal stresses which are altered by exposure to the radiation. The material is exposed in associated areas (e.g. a spiral) such that the internal stresses within the layer of material and altered internal stresses in the associated areas are substantially offset to reduce distortion in the X-ray mask.

16 Claims, 3 Drawing Sheets

PATTERN WRITING METHOD DURING X-RAY MASK FABRICATION

FIELD OF THE INVENTION

This invention pertains to X-ray mask fabrication and more specifically to methods of forming patterns in X-ray masks with less distortion.

BACKGROUND OF THE INVENTION

Generally, for convenience and because standard semiconductor tools can be used in the fabrication process, X-ray masks are formed on a semiconductor wafer, such as a silicon wafer. The silicon wafer operates like a frame and support for the mask. A thin membrane is deposited on the upper surface of the wafer in the form of a thin layer. A layer of X-ray absorbing material, such as some safe heavy metal or alloy, is deposited on the upper surface of the membrane layer. The X-ray absorbing layer is patterned by applying a hard mask material and resist. The resist is patterned (or exposed) with an electron beam (E-beam) device and a hard mask is formed by etching the hard mask layer through the patterned photoresist layer. The hard mask is then used as an etch mask to pattern the X-ray absorbing layer. At some point in the process the wafer is etched from the membrane layer in a circle or a rectangle to form a thin membrane. The mask thus allows X-rays to pass through the thin membrane and portions of the X-ray absorbing layer that have been etched away. The entire procedure is known as a process flow and two different process flows are commonly used.

In the first process flow, commonly referred to as a wafer flow, all processing is done on the wafer with one of the final steps being the back etching of the silicon wafer to form the membrane. The wafer flow was primarily created to solve formatting issues. It allows X-ray mask processing to be conducted in semiconductor tools that are not dramatically different from the standard wafer processing tools supplied by the industry. The X-ray mask specific processing steps (membrane formation and wafer mounting to a support ring) are at the end of the flow. This minimizes the modifications necessary to both the tools and the wafer processes. However, the creation of the membrane and the mounting of the wafer creates significant pattern displacement errors (~0.15 μm) in the mask.

The second process flow is commonly referred to as a membrane flow. In the membrane flow the membrane is formed early in the process (generally after absorber deposition) and the remaining processing is carried out on the membrane. The membrane flow process was derived to remove the errors in the wafer flow process by conducting the mask specific processing steps before the absorber layer is patterned. While this greatly reduces the errors associated with membrane formation and wafer mounting, it also increases the modifications to both the equipment (the tools must accept an X-ray mask format rather than a wafer) and the processes (the patterning defining process steps are carried out on a membrane rather than a wafer).

The major problem in the formation of X-ray masks using the membrane flow is that any film on a membrane type structure that alters its stress during any kind of exposure produces stress and distortions in the membrane.

It is a purpose of the present invention to provide new and improved methods of fabricating X-ray masks.

It is another purpose of the present invention to provide new and improved methods of fabricating X-ray masks which compensate for distortion during pattern writing so as to greatly improve the accuracy.

It is a further purpose of the present invention to provide new and improved methods of fabricating X-ray masks including the use of a new pattern writing technique which substantially reduces distortion during fabrication of the X-ray mask.

SUMMARY OF THE INVENTION

The above problems and others are at least partially solved and the above purposes and others are realized in a pattern writing method for membrane structure fabrication including the steps of forming a membrane structure, and forming a material system on the membrane structure including the steps of providing a layer of material with internal stresses, the internal stresses being altered by exposure of the material to radiation to produce altered internal stresses in exposed areas, and exposing the layer of material to radiation to define a pattern, the exposing being performed in associated areas such that the internal stresses within the layer of material and altered internal stresses in the associated areas are substantially offset to reduce distortion in the material system and in the membrane structure.

Generally, this method is used to fabricate X-ray masks with smaller errors, or less distortion, in a pattern. In a specific example, the method includes forming an etch mask on a layer of X-ray absorbing material including the steps of providing a layer of photoresist sensitive to an electron beam, the photoresist having internal stresses which are altered by exposure to the electron beam, and exposing the photoresist to the electron beam to define a pattern, the exposing being performed in associated areas such that the internal stresses within the photoresist and altered internal stresses in the associated areas are substantially offset to reduce distortion in the etch mask and in the layer of X-ray absorbing material.

Also, in a preferred embodiment, the radiation sensitive material is exposed to radiation to define the chosen pattern by exposing the layer of material in a spiral path starting at approximately a central portion of the layer of material. This produces a minimum amount of distortion while maintaining maximum patterning speed.

BRIEF DESCRIPTION OF THE DRAWINGS

Referring to the drawings.

DESCRIPTION OF THE PREFERRED EMBODIMENT

Figure 1:
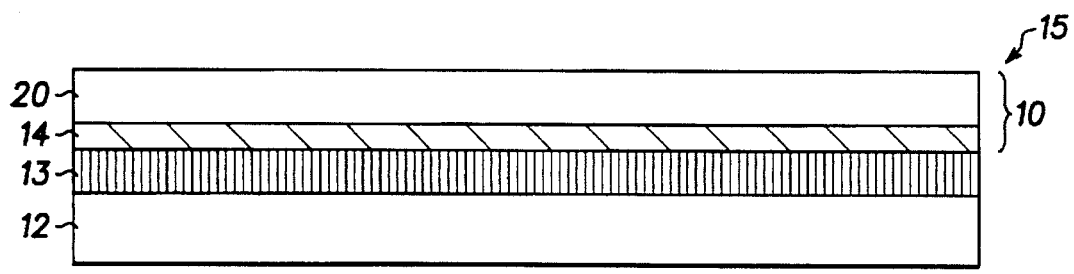
FIG. 1 is a simplified sectional view illustrating various layers used in the fabrication of an X-ray mask.

Turning now to the drawings, FIG. 1 is a simplified sectional view of a step in a process of forming a refractory radiation mask 10 by membrane flow in accordance with the present invention. In this disclosure the radiation used for exemplary purposes is X-rays but it could also include light, electrons, ions, or other charged particles. Mask 10 includes a supporting member (not shown) which is referred to herein as a "wafer". For convenience and because semiconductor tools and equipment are generally utilized in the fabrication and use processes, the supporting member will be a semiconductor wafer, such as a silicon wafer. Also, the wafer commonly used by today's manufacturers is a silicon wafer 76 mm in diameter and 2 mm thick. However, it should be understood that other members, materials, and sizes might be utilized and the term "wafer" is intended to encompass all such members.

A membrane layer 12 is formed on a planar upper surface of the supporting member by any convenient method, including epitaxial growth, deposition, etc. Generally, membrane layer 12 is formed of some convenient material, such as silicon (Si), silicon nitride (SiN), or silicon carbide (SiC), or the like, and in this specific example is boron-doped silicon (B:Si). Also, when membrane layer 12 is formed on supporting member 11 it is formed with tension. For the specific example used herein, membrane layer 12 is approximately 2.5 μm thick and has original stresses of approximately 5E8 dyne/cm$^2$. The material used for membrane layer 12 does not have a significant effect on the resulting distortions. As is understood by those skilled in the art, it is only necessary that membrane layer 12 be of a material and thickness such that it is transparent to X-rays during use of the mask.

While the present method uses methods of fabricating X-ray masks, it should be understood that other types of masks (e.g. ion masks, electron masks, etc.) might be fabricated by the same process and it is intended that the terms "mask" and "membrane structure" will include all such variations. Further, while a specific membrane structure has been utilized for purposes of this disclosure, it should be understood that the term membrane structure is intended to encompass all membranes or free standing layers which will be effected by the pattern writing procedures disclosed herein.

A bi-layer plating base, including a layer 13 of chromium (Cr) and a layer 14 of gold (Au), is deposited on the surface of membrane layer 12 as an X-ray absorbing material. Generally, the X-ray absorbing material may be any convenient material which will absorb X-rays passing through membrane layer 12 so as to prevent the X-rays from passing on through layer 13. Materials such as tantalum-silicon nitride (TaSiN), tantalum-boride (Ta$_4$B), heavy metals, etc. are commonly used. In this specific embodiment, chromium layer 13 is approximately 0.005 μm thick and gold layer 14 is approximately 0.03 μm thick. The bi-layer plating base has original stresses of approximately 3E8 dyne/cm$^2$. The stress of the bi-layer plating base is normally measured as a stack so that only one value is provided.

Because the present fabrication technique generally applies to the membrane flow, a portion of the wafer is removed at this time (prior to the formation of an etch mask 15), thereby essentially forming membrane layer 12 into a membrane. The membrane may have substantially any desired configuration but in a preferred embodiment will be rectangular. While the present novel method is most applicable to the wafer flow, it will be understood that in some special applications it may also be applicable to the membrane flow, or to any modified types of flow.

An etch mask 15 is formed on the upper surface of layer 14 for the purpose of transferring a chosen pattern to layers 13 and 14, as will be explained in more detail below.

Generally, at least one layer of etch mask 15 is formed of material which is sensitive to radiation of some type, e.g. electron beams, light, etc. While etch mask 15 may be formed using a wide variety of methods and materials or layers of materials, all well known in the art, in this embodiment etch mask 15 includes a single layer of photoresist layer 20 which is being used for purposes of simplifying this explanation. Layer 20 is formed of polymethylmethacrylate (PMMA) on which can easily be written the chosen pattern, for example with an electron beam (E-beam) device or the like. After the chosen pattern is formed in photoresist layer 20, the bi-layer plating base is etched to transfer the pattern thereto, using photoresist layer 20 as a mask. Etch mask 15 is removable so that once the chosen pattern has been transferred to the bi-layer plating base etch mask 15 can be easily removed.

Figure 2:
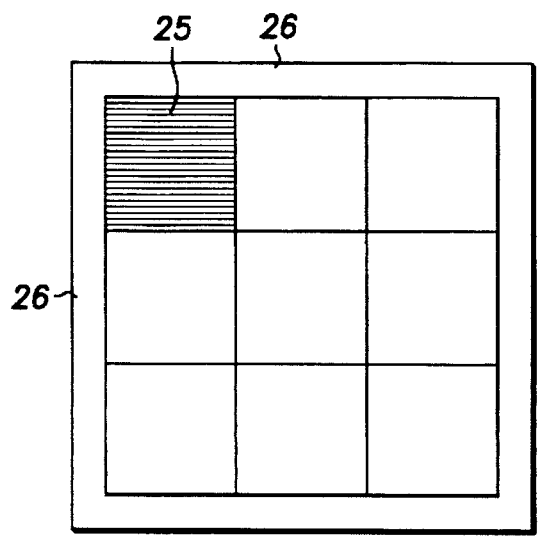
FIG. 2 is a view in top plan of the structure of FIG. 1, illustrating cells of a pattern to be written.
Figure 3:
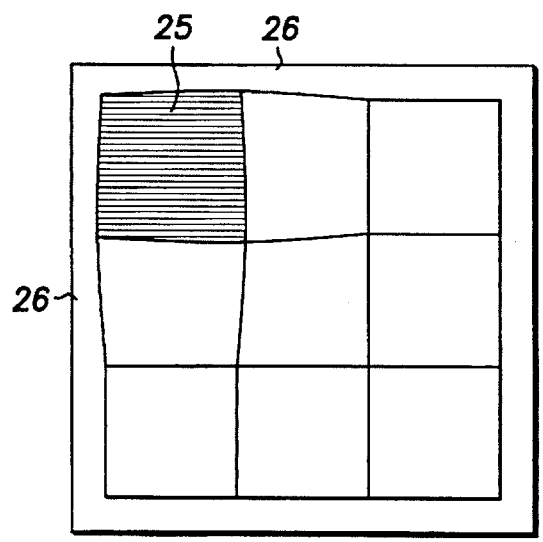
FIG. 3 is a view similar to FIG. 2 illustrating distortion in the structure due to the writing procedure.

The problem that occurs when writing a pattern on a film on a membrane type structure is that the film alters its stress during any kind of exposure. In the structure of FIG. 1, for example, as an E-beam device writes the mask pattern, hydrocarbon chains within layer 20 break down. This decreases the tensile force exerted by resist (layer 20) and thus the membrane/resist must reach a new equilibrium between exposed and unexposed regions. A simple schematic of this is illustrated in FIGS. 2 and 3. FIG. 2 is a view in top plan of the structure of FIG. 1, illustrating cells of a pattern to be written and FIG. 3 is a view similar to FIG. 2 illustrating distortion in the structure due to the writing procedure.

In FIG. 3, a first cell 25 of the pattern has been written or exposed (the stress has been relieved) by an E-beam device. The remaining cells of the pattern and a narrow border 26 around the perimeter of the membrane area (which is never exposed) have not been written or exposed. Border 26 prevents unintended patterning on the bulk material of the wafer (outside of the membrane area), which could occur due to in-plane distortion. FIG. 3 illustrates the manner in which the membrane/resist distorts after cell has been written or exposed. The E-beam writing decreases the stress in cell 25 and thus cell 25 expands until its stress is again in equilibrium with the surrounding material. This is quite undesirable because the E-beam device will write a second cell 27 as though the membrane/resist were still undistorted. (as illustrated in FIG. 2). Thus, the pattern will continue to be written on a distorted membrane/resist system and the membrane/resist system will continue to distort further as subsequent cells are written. The final pattern produced will not match the pattern programmed into the E-beam device.

Figure 4:
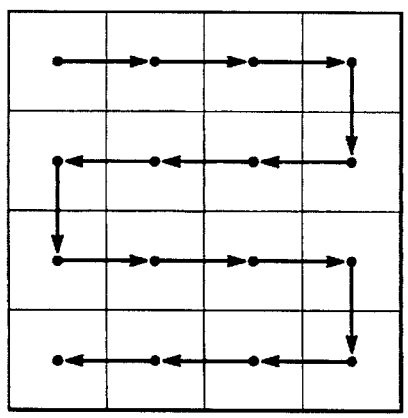
FIGS. 4 and 5 illustrate prior art writing procedures which resulted in the distortion illustrated in FIG. 3.
Figure 5:
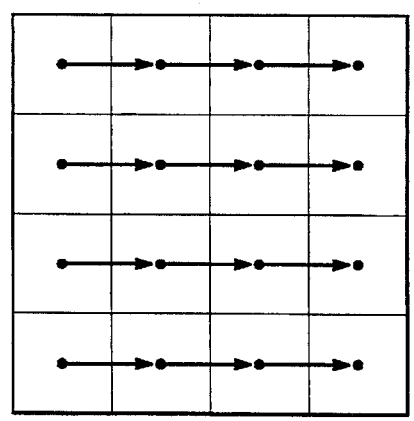

While E-beam devices generally have the flexibility to write the pattern cells in any order, two methods are used extensively. These methods are the serpentine method illustrated in FIG. 4 and the unidirectional method illustrated in FIG. 5. In both figures, the arrows illustrate the direction of movement of the E-beam device. The serpentine style is the fastest writing approach since all cells are written consecutively. With the unidirectional style writing method, each row is written in the same direction and then the E-beam repositions to the beginning of the next row. Both of these writing methods produce the pattern distortion explained above.

Figure 6:
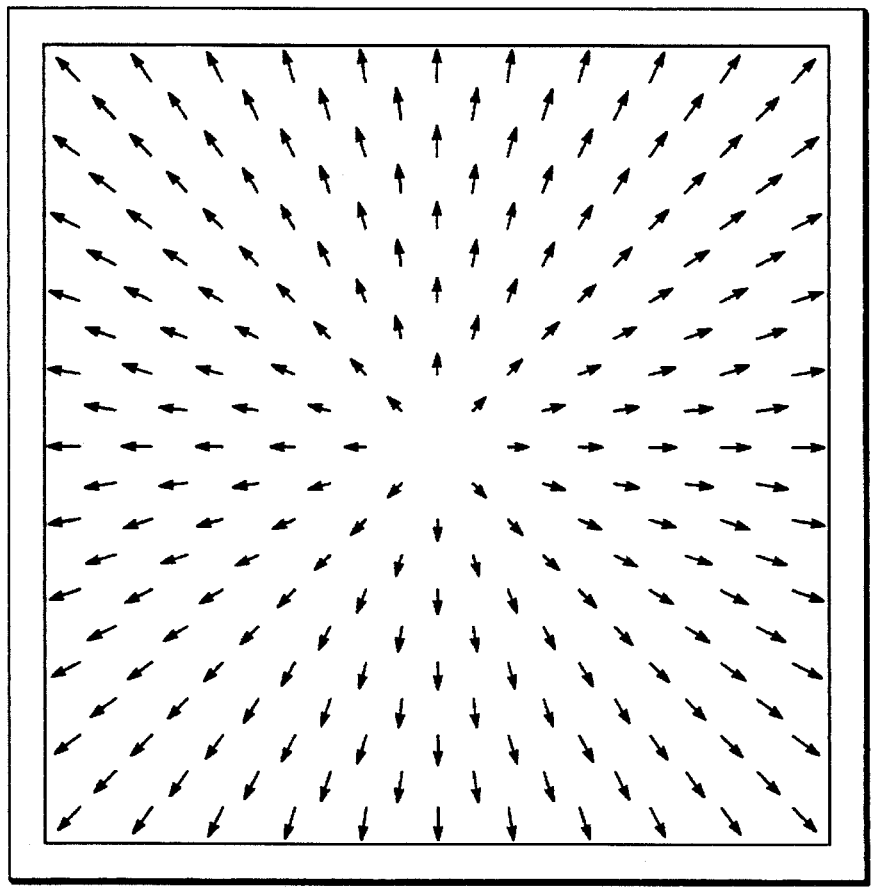
FIG. 6 illustrates magnification due to uniform stress relief over an entire patterned area.

The simple magnification which occurs due to relieving resist stresses in the entire patterned area is illustrated in FIG. 6. In a sense, the distortion due to sequential resist stress relief (sequential writing as disclosed in FIGS. 4 and 5) takes place on this "backdrop" of simple magnification.

Figure 7:
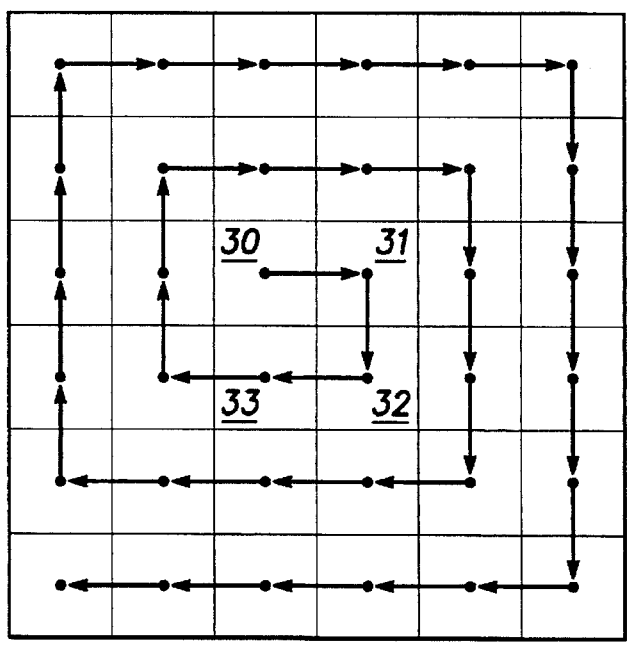
FIG. 7 illustrates a writing procedure in accordance with the present invention.
Figure 8:
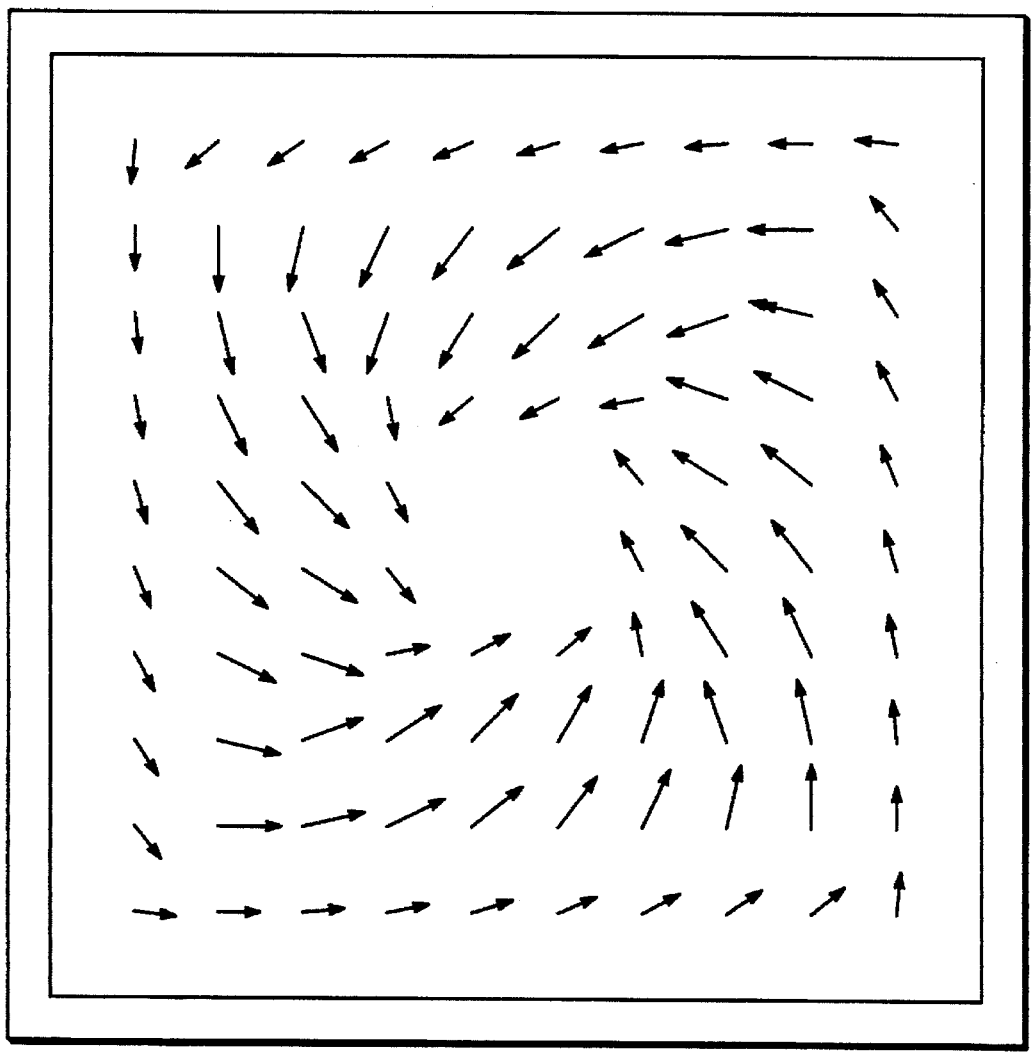
FIG. 8 is a distortion map illustrating resultant distortions due to the writing procedure illustrated in FIG. 7.

Referring specifically to FIG. 7, a novel pattern writing sequence is illustrated which substantially counteracts the simple magnification of FIG. 6 while still maintaining maximum patterning speed. A first cell to be written, designated 30, borders the pattern center rather than a corner of the area to be exposed. The next three cells, designated 31, 32, and 33, respectively, patterned, complete an exposed square region at the center of the membrane area. This stress-relieved center square causes all unwritten cells to displace radially, similar to the magnification error illustrated in FIG. 6. As subsequent cells are written, the patterned area contracts toward the center of the membrane area, counteracting the magnification displayed in FIG. 6. Thus, the exposing is performed in associated areas such that the internal or original stresses within layer 20 and altered internal stresses (altered by the writing process) in the associated areas are substantially offset to reduce distortion in the material system and in the membrane structure. A distortion map is provided in FIG. 8, which map illustrates the distortion resulting from the novel patterning procedure. This map illustrates that the maximum distortion vector has been reduced over 50% to 17.8 nm.

While a writing procedure utilizing a spiral starting at approximately a central portion of the layer of radiation sensitive material (or the membrane area) is disclosed as a preferred embodiment, it should be noted that other writing procedures might be utilized which expose associated areas such that the internal or original stresses within layer 20 and altered internal stresses (altered by the writing process) in the associated areas are substantially offset to reduce distortion in the material system and in the membrane structure. Examples of other writing procedures are: a spiral path starting at an outer edge; discontinuously jumping to associated or offsetting cells or areas; etc. It should also be noted that the present writing system can be used in multi-pass writing techniques, the simplest example of which is a two-pass exposure in which each cell is only exposed 50% of the required exposure on each pass. In multi-pass writing techniques, the same or different paths might be used for each pass.

Thus, new and improved methods of fabricating X-ray masks have been disclosed, which methods compensate for distortion during pattern writing so as to greatly improve the accuracy. Further, new and improved methods of fabricating X-ray masks including the use of a new pattern writing technique which substantially reduces distortion during fabrication of the X-ray mask have been disclosed. The new technique not only substantially reduces distortion in the pattern caused by writing radiation sensitive material but also, in the preferred embodiment, maintains maximum patterning speed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A pattern writing method for membrane structure fabrication comprising the steps of:
   forming a membrane structure; and
   forming a material system on the membrane structure including the steps of providing a layer of material with internal stresses, the internal stresses being altered by exposure of the material to radiation to produce altered internal stresses in exposed areas, and exposing the layer of material to radiation to define a pattern, the exposing being performed in associated areas such that the internal stresses within the layer of material and altered internal stresses in the associated areas are substantially offset to reduce distortion in the material system and in the membrane structure.

2. A pattern writing method for membrane structure fabrication as claimed in claim 1 wherein the step of exposing the layer of material to the radiation to define the pattern includes exposing the layer of material in a spiral path.

3. A pattern writing method for membrane structure fabrication as claimed in claim 2 wherein the step of exposing the layer of material in a spiral path includes starting the spiral path at approximately a central portion of the layer of material.

4. A pattern writing method for mask fabrication comprising the steps of:
   forming a layer of radiation absorbing material;
   forming a uniform membrane layer on the radiation absorbing layer; and
   forming an etch mask on the layer of radiation absorbing material including the steps of providing a layer of material sensitive to a radiation, the layer of material having internal stresses, the internal stresses being altered by exposure to the radiation of the layer of material to produce altered internal stresses in exposed areas, and exposing the layer of material to the radiation to define a pattern, the exposing being performed in associated areas such that the internal stresses within the layer of material and altered internal stresses in the associated areas are substantially offset to reduce distortion in the etch mask and in the layer of radiation absorbing material.

5. A pattern writing method for mask fabrication as claimed in claim 4 wherein the step of exposing the layer of material to the radiation to define the pattern includes exposing the layer of material in a spiral path.

6. A pattern writing method for mask fabrication as claimed in claim 5 wherein the step of exposing the layer of material in a spiral path includes starting the spiral path at approximately a central portion of the layer of material.

7. A pattern writing method for mask fabrication as claimed in claim 4 wherein the step of forming the membrane layer includes prestressing the membrane layer with tension stress.

8. A pattern writing method for mask fabrication as claimed in claim 4 including in addition a step of defining a rectangular membrane area on the membrane layer and the layer of radiation absorbing material with the pattern being defined within the rectangular membrane area.

9. A pattern writing method for mask fabrication as claimed in claim 4 including in addition a step of forming the pattern through the layer of radiation absorbing material.

10. A pattern writing method for mask fabrication as claimed in claim 9 wherein the step of forming the pattern through the layer of radiation absorbing material includes removing portions of the layer of radiation absorbing material by etching the layer of radiation absorbing material to form the pattern.

11. A pattern writing method for mask fabrication as claimed in claim 4 wherein the step of providing the layer of material sensitive to the radiation includes providing a layer of photoresist.

12. A pattern writing method for mask fabrication as claimed in claim 11 wherein the step of exposing the layer of material to the radiation to define a pattern includes writing the pattern in the layer of photoresist using an electron beam device.

13. A pattern writing method for X-ray mask fabrication comprising the steps of:

providing a wafer with a planar surface;

positioning a membrane layer on the planar surface of the wafer;

positioning a layer of X-ray absorbing material on the membrane layer;

positioning a material system on the layer of X-ray absorbing material, the material system including a layer of material sensitive to a radiation, the layer of material having internal stresses, the internal stresses being altered by exposure to the radiation of the layer of material to produce altered internal stresses in exposed areas;

forming a centrally located, rectangularly shaped opening through the wafer to define a rectangular membrane area on the membrane layer;

forming a portion of the material system overlying the rectangular membrane area into an etch mask on the layer of X-ray absorbing material including exposing the layer of material to the radiation to define a pattern, the exposing being performed in associated areas such that the internal stresses within the layer of material and altered internal stresses in the associated areas are substantially offset to reduce distortion in the etch mask and in the layer of X-ray absorbing material; and removing exposed portions of the layer of material.

14. A pattern writing method for X-ray mask fabrication as claimed in claim 13 wherein the step of positioning the material system includes positioning a material system including a layer of hard mask material and a layer of photoresist.

15. A pattern writing method for X-ray mask fabrication as claimed in claim 14 wherein the step of exposing the layer of material to the radiation to define the pattern includes exposing the layer of material in a spiral path.

16. A pattern Writing method for X-ray mask fabrication as claimed in claim 15 wherein the step of exposing the layer of material in a spiral path includes starting the spiral path at approximately a central portion of the layer of material.

* * * * *